United States Patent
Mende et al.

(10) Patent No.: US 9,209,593 B2
(45) Date of Patent: Dec. 8, 2015

(54) METHOD OF CONTROLLING ELECTRO-OPTICAL PROBE GAIN AND SENSITIVITY

(71) Applicant: Tektronix, Inc., Beaverton, OR (US)

(72) Inventors: Michael J. Mende, Portland, OR (US); Richard A. Booman, Lake Oswego, OR (US)

(73) Assignee: Tektronix, Inc., Beaverton, OR (US)

( * ) Notice: Subject to any disclaimer, the term of this patent is extended or adjusted under 35 U.S.C. 154(b) by 184 days.

(21) Appl. No.: 14/133,413

(22) Filed: Dec. 18, 2013

(65) Prior Publication Data

US 2015/0171589 A1    Jun. 18, 2015

(51) Int. Cl.
| G01B 9/02 | (2006.01) |
| H01S 3/10 | (2006.01) |
| G01R 1/07 | (2006.01) |
| G01R 35/00 | (2006.01) |

(52) U.S. Cl.
CPC ............ *H01S 3/10015* (2013.01); *G01R 1/071* (2013.01); *G01R 35/005* (2013.01)

(58) Field of Classification Search
CPC .............................. G01R 1/071; G01R 35/005
See application file for complete search history.

(56) References Cited

U.S. PATENT DOCUMENTS

2006/0244974 A1* 11/2006 Pfaff .............................. 356/517
2007/0046947 A1* 3/2007 Lo et al. ........................ 356/492

FOREIGN PATENT DOCUMENTS

DE    202006019953 U1    6/2007
EP    0919790 A2    6/1999

OTHER PUBLICATIONS

Extended European Search Report for European Patent Application No. 14198902.0, dated May 28, 2015, 6 pages, Munich.

* cited by examiner

*Primary Examiner* — Tony Ko
(74) *Attorney, Agent, or Firm* — Marger Johnson

(57) ABSTRACT

A method of controlling the gain or sensitivity of a test and measurement system. The test and measurement system includes a host, a controller with an optical transmitter and an optical receiver, optical-to-electrical converter, an accessory head, and a device under test. The method includes determining whether a gain or sensitivity adjustment of the test and measurement system is required, determining the amount of gain or sensitivity adjustment, and adjusting the output power of a laser of the optical transmitter in response to the determination of the gain or sensitivity adjustment of the test and measurement system.

10 Claims, 2 Drawing Sheets

METHOD OF CONTROLLING ELECTRO-OPTICAL PROBE GAIN AND SENSITIVITY

TECHNICAL FIELD

This disclosure relates generally to test and measurement systems and signal acquisition accessories and more particularly to signal acquisition accessories using an optical sensor.

BACKGROUND

There is an increasing need in the electronics industry for test and measurement instruments, such as oscilloscopes, logic analyzers and the like, to measure electrical signals that are galvanically isolated and contain higher frequency content. One way to measure electrical signals that are galvanically isolated and have higher frequency content is to use an electro-optic probe.

Traditionally, the gain and sensitivity of an electro-optic probe is adjusted by controlling a variable gain amplifier of an optical-to-electrical converter. Controlling a variable gain of the optical-to-electrical converter results in higher sensitivity but a reduction in the overall bandwidth and frequency response of the test and measurement system. That is, gain and/or sensitivity for the test and measurement system is adjusted at the optical-to-electrical converter after a light beam has been emitted and a measurement has been taken at a device under test (DUT). Typically, the electro-optic probe also requires a user to develop an application specific integrated circuit (ASIC) to achieve the desired parameters of the electro-optic probe. In order to achieve the ability to have an adjustable gain, the dynamic range, noise, frequency and bandwidth response and overall system complexity must be compromised.

SUMMARY

Certain embodiments of the disclosed technology include a method of controlling the gain or sensitivity of a test and measurement system. The test and measurement system includes a host, a controller with an optical transmitter and an optical receiver, an accessory head, and a device under test. The method includes determining whether a gain or sensitivity adjustment of the test and measurement system is required, determining the amount of gain or sensitivity adjustment, and adjusting the output power of a laser of the optical transmitter in response to the determination of the gain or sensitivity adjustment of the test and measurement system.

Certain embodiments of the disclosed technology also include a test and measurement system including a device under test, a host, an accessory head with an optical sensor connected to the device under test, and a controller connected to the accessory head and the host. The controller includes an optical transmitter with a laser, an optical receiver, and an optical-to-electrical converter. The controller is configured to adjust the output of the laser of the optical transmitter to adjust the gain or sensitivity of the measurements from the device under test.

DETAILED DESCRIPTION

Figure 1:
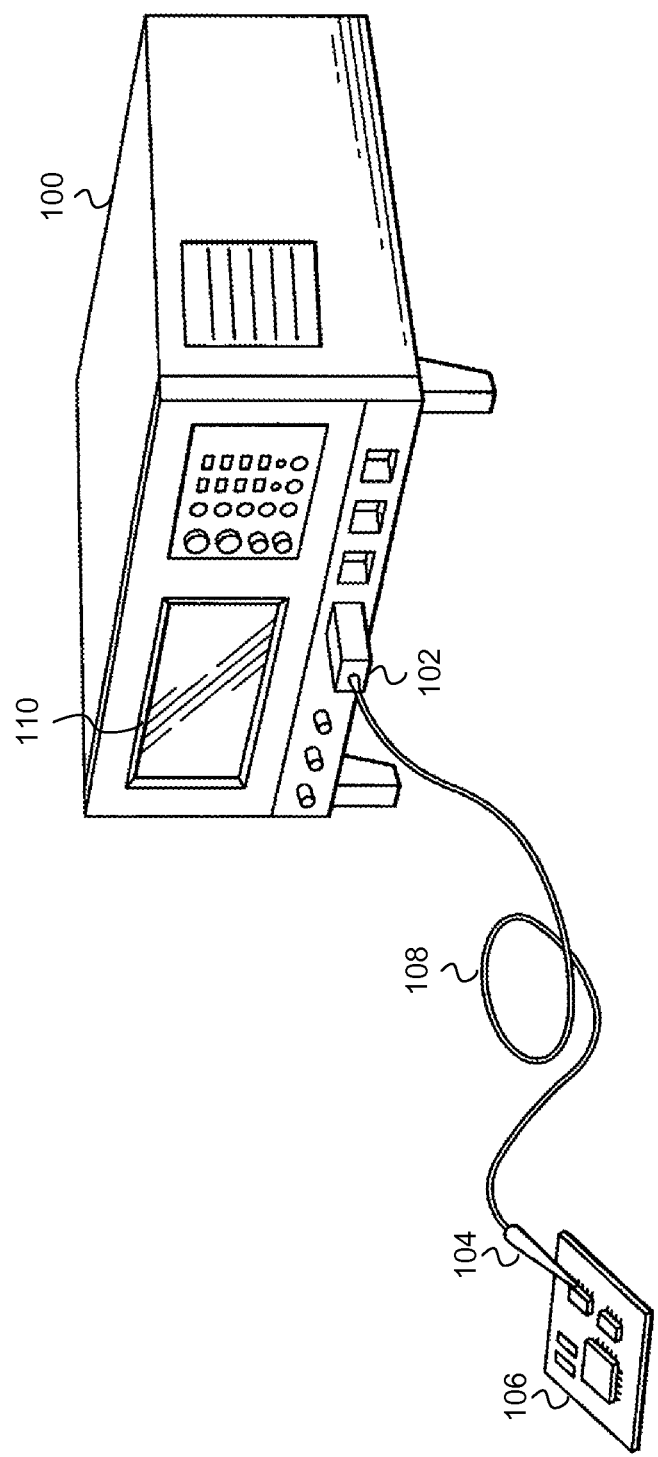
FIG. 1 illustrates the test and measurement system according to the disclosed technology.

In the drawings, which are not necessarily to scale, like or corresponding elements of the disclosed systems and methods are denoted by the same reference numerals.

The test and measurement system of the disclosed technology has the capability to sense a measurement of a signal under test from a DUT 106 using an optical sensor in an accessory head 104. Referring to FIG. 1, there is illustrated a test and measurement system which includes a host 100, accessory head 104, and an optical transmission path 108 extending from the accessory head 104 to a controller 102. The accessory head 104 is connected to a DUT 106. The controller contains signal acquisition probing circuitry needed to provide the optical signal to the accessory head 104 and convert the returning optical signal to an electrical signal. The controller 102 then transmits the resulting measurement to host 100.

The electrical signal representing the measured signal from the DUT 106 output from the controller 102 is coupled to acquisition circuitry within the host 100 that converts the electrical signal into digital data values and stores the data values in memory (not shown) or displays the data on a display 110.

Figure 2:
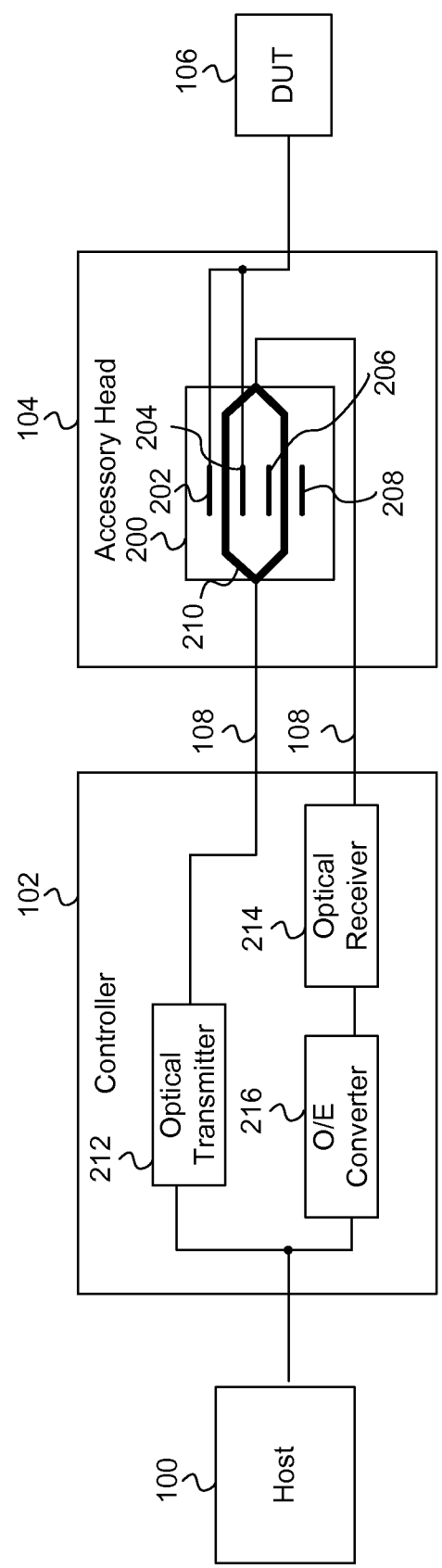
FIG. 2 illustrates a block diagram of the test and measurement system according to the disclosed technology.

FIG. 2 is a block diagram of the test and measurement system. As stated previously, the test and measurement system includes a host 100, a controller 102, an accessory head 104, and a DUT 106.

The accessory head 104 includes an optical sensor 200, such as an optical voltage sensor. The optical sensor may be, for example, a Mach-Zehnder optical sensor. The inputs from the DUT 106 are connected to the input signal electrodes 202 and 204 of the optical sensor 200. The optical sensor 200 also includes bias electrodes 206 and 208 that are connected to a bias control (not shown). Waveguide 210 in the optical sensor 200 directs light emitted from optical transmitter 212 located within the controller 102, to allow for a measurement to be taken from DUT 106. As light travels through the waveguide 210, an electric field from the electrodes causes a phase shift of the guided light, which allows for a voltage measurement to be taken from DUT 106.

As mentioned above, controller 102 includes an optical transmitter 212, such as a laser. Controller 102 also includes an optical receiver 214 and an optical-to-electrical converter 216. In operation, the optical transmitter 212 in the controller 102 emits a light beam to the optical sensor 200 along waveguide 210. The optical sensor 200 reads the output from the DUT 106 based on the received light beam from the optical transmitter 212, and outputs the resulting light beam to the optical receiver 214. The optical-to-electrical converter 216 converts the optical signal received at the optical receiver 214 to an amplitude modulated electrical signal that is representative of the signal being measured on the DUT 106.

Conventionally, the gain of the optical-to-electrical converter 216 is adjusted to change the sensitivity of the test and measurement system as a whole. For example, conventionally, the optical-to-electrical converter 216 includes two different gain settings for high sensitivity and low sensitivity. However, as mentioned above, achieving large changes in the gain of the receiver comes with trade-offs in dynamic range, noise, frequency response and bandwidth and overall system complexity.

In the disclosed technology, rather than changing the gain settings at the optical-to-electrical converter 216, a fixed optical-to-electrical converter 216 is used. To control the gain and sensitivity of the overall test and measurement system, the output power of the optical transmitter 212 is adjusted. The optical transmitter 212 is typically contained in a feedback control circuit (not shown) that monitors the output power from the transmitter and precisely controls the drive current to the transmitter in order to keep the transmitter output power at the desired level. This drive current can be adjusted over a very wide range with a corresponding change in the optical transmitter 212 output power. The wavelength and line width of the optical transmitter 212 can also be controlled independently of the drive current. Since the overall system gain is directly proportional to the transmitter output power, this change in the transmitter drive level translates into a corresponding change in the overall system gain. If the output power of the optical transmitter 212 is adjusted, rather than adjusting an amplifier of the optical receiver 214 as was done traditionally, gain and sensitivity changes of over 10 times can be realized without degradation in the bandwidth and frequency response.

The output of the optical transmitter 212 is controlled by controller 102. A user can input the desired gain or sensitivity of the accessory head 104 into the host 100. The host 100 then sends the desired gain or sensitivity to the controller 102 and the controller 102 adjusts the output power of the optical transmitter 212 accordingly.

Rather than a user setting the desired gain or sensitivity, the gain or sensitivity of the measurement system may also be a variable gain control set during a calibration or compensation routine of the accessory head 104. A calibration signal is sent to the accessory head 104 and then an output from the accessory head 104 is returned to the optical receiver 214. The output from the optical receiver 214 is then converted via the optical-to-electrical converter 216 and the resulting converted signal is sent to the host 100. Depending on the output of the signal sent to the host 100, the host 100 can determine if the laser in the optical transmitter 212 needs to be adjusted.

A more intense light beam from optical transmitter 212 provides a higher reading from the DUT 106 through the optical sensor 200 in the accessory head 104. A less intense light beam may provide a lower reading from the DUT 106. Accordingly, if a greater gain is needed in the test and measurement system, the light beam of the optical transmitter 212 is set to a higher output power.

Adjusting the output power of the laser at the optical transmitter 212 rather than the gain of the optical-to-electrical converter 216 allows for greater gain and sensitivity without the loss of dynamic-range or frequency and bandwidth capabilities. Further, the overall measurement system does not become more complex because a user would no longer be required to have an ASIC to achieve the desired parameters, or to have a complicated gain control circuit in the receiver. Further, adjusting the gain and sensitivity of the system at the optical transmitter 212 allows for reduced noise in the overall system.

Host 100 may be, for example, a test and measurement instrument such as an oscilloscope, logic analyzer, spectrum analyzer or similar such devices having an accessory device interface for accepting an accessory device.

Although controller 102 has been shown in FIG. 1 as an independent component powered by host 100, the controller 102 may also be an independently powered controller or may be placed within the host 100 rather than as a separate component. That is, the host 100 may include the optical transmitter 212, the optical receiver 214, and the optical-to-electrical converter 216.

The term "controller" and "processor" as used herein is intended to include microprocessors, microcomputers, ASICs, and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects of the invention, and such data structures are contemplated within the scope of computer executable instructions and computer-usable data described herein.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

What is claimed is:

1. A method of controlling the gain or sensitivity of a test and measurement system, the test and measurement system including a host, an optical transmitter, an optical receiver, an optical-to-electrical converter, an accessory head, and a device under test, the method comprising:
   determining whether a gain or sensitivity adjustment of the test and measurement system is required;
   determining an amount of gain or sensitivity adjustment; and
   adjusting the output power of a laser of the optical transmitter in response to the determination of the gain or sensitivity adjustment of the test and measurement system.

2. The method of claim 1, in which the determining whether the gain or sensitivity adjustment of the test and measurement system is required further includes performing a calibration or compensation routine, including:
   sending a calibration or compensation signal to an optical sensor in the accessory head;
   receiving at the optical receiver an output signal from the optical sensor in the accessory head in response to the calibration or compensation signal;
   converting the received optical signal to a converted electrical signal via an optical-to-electrical converter;
   sending the converted electrical signal to the host;
   receiving the converted electrical signal at the host; and
   determining a gain or sensitivity adjustment based on the received converted electrical signal.

3. The method of claim 1, in which the determining whether the gain or sensitivity adjustment of the test and measurement system is required further includes determining if a user has input a desired gain or sensitivity adjustment,
   wherein determining the amount of the gain or sensitivity adjustment includes determining the desired gain or sensitivity adjustment entered by the user.

4. The method of claim 1, further includes:
adjusting the output power of the light beam to a higher value when sensitivity greater gain is required.

5. A test and measurement system, comprising:
a host;
a device under test;
an accessory head with an optical sensor connected to the device under test;
a controller connected to the accessory head and the host, the controller including:
an optical transmitter with a laser,
an optical receiver, and
an optical-to-electrical converter,
wherein the controller is configured to adjust the output of the laser of the optical transmitter to adjust the gain or sensitivity of the measurements from the device under test.

6. The test and measurement system of claim 5, wherein the optical receiver includes a fixed amplifier.

7. The test and measurement system of claim 5, further comprising a user input of a desired gain or sensitivity of the measurement of the device under test and wherein the controller is configured to adjust the output of the laser of the optical transmitter in response to the user input of the desired gain or sensitivity.

8. The test and measurement system of claim 5, wherein the controller is further configured to adjust the gain or sensitivity of the test and measurement system based on an output from a calibration or compensation routine.

9. The test and measurement system of claim 5, wherein the controller is further configured to increase the output from the laser when a higher sensitivity or gain of the test and measurement system is required.

10. The test and measurement system of claim 5, wherein the controller is located in a test and measurement instrument.

* * * * *